(12) United States Patent
Lee

(10) Patent No.: US 7,982,526 B2
(45) Date of Patent: Jul. 19, 2011

(54) ACTIVE-TIME DEPENDENT BIAS CURRENT GENERATION FOR SWITCHED-CAPACITOR CIRCUITS

(75) Inventor: Chun C. Lee, Ann Arbor, MI (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 12/212,486

(22) Filed: Sep. 17, 2008

(65) Prior Publication Data

US 2010/0066436 A1 Mar. 18, 2010

(51) Int. Cl.
G06G 7/18 (2006.01)
H03M 1/12 (2006.01)

(52) U.S. Cl. ............ 327/337; 327/91; 327/96; 327/554; 341/172

(58) Field of Classification Search ............ 327/91, 327/94, 96, 336, 337, 554; 341/172
See application file for complete search history.

(56) References Cited

U.S. PATENT DOCUMENTS

| | | | |
|---|---|---|---|
| 3,848,195 A | 11/1974 | Kiko | |
| 5,166,630 A * | 11/1992 | Lee | 327/554 |
| 5,691,720 A * | 11/1997 | Wang et al. | 341/143 |
| 5,982,315 A * | 11/1999 | Bazarjani et al. | 341/143 |
| 6,369,745 B1 * | 4/2002 | Lee et al. | 341/166 |
| 6,407,623 B1 | 6/2002 | Bazarjani et al. | |
| 6,535,039 B2 | 3/2003 | Nanba et al. | |
| 6,552,676 B1 | 4/2003 | Bjorksten et al. | |
| 6,614,285 B2 * | 9/2003 | Lee et al. | 327/337 |
| 6,653,886 B1 * | 11/2003 | Lee et al. | 327/374 |
| 6,839,015 B1 * | 1/2005 | Sutardja et al. | 341/161 |
| 6,967,610 B1 * | 11/2005 | Sutardja et al. | 341/161 |
| 7,002,501 B2 | 2/2006 | Gulati et al. | |
| 7,081,789 B2 * | 7/2006 | Klemmer | 327/554 |
| 7,750,837 B2 * | 7/2010 | Wang et al. | 341/172 |
| 2004/0085135 A1 | 5/2004 | Jaehne et al. | |
| 2006/0125463 A1 | 6/2006 | Yen et al. | |
| 2007/0152752 A1 | 7/2007 | Oishi | |
| 2008/0284406 A1 | 11/2008 | Kapusta, Jr. | |
| 2010/0026542 A1 * | 2/2010 | Wang et al. | 341/155 |

FOREIGN PATENT DOCUMENTS

EP 1168603 A1 1/2002

OTHER PUBLICATIONS

Andersen et al., "A cost-efficient high-speed 12-bit pipeline ADC in 0.18-μm digital CMOS," Solid-State Circuits, IEEE Journal of, vol. 40, No. 7, pp. 1506-1513, Jul. 2005.*
International Search Report and Written Opinion—PCT/US2009/057365, International Search Authority—European Patent Office—Feb. 10, 2010.

* cited by examiner

*Primary Examiner* — Lincoln Donovan
*Assistant Examiner* — Patrick O'Neill
(74) *Attorney, Agent, or Firm* — Ramin Mobarhan

(57) ABSTRACT

Exemplary embodiments of the disclosure include adaptively generating a bias current for a switched-capacitor circuit. An exemplary apparatus includes a first phase signal and a second phase signal operating at a sampling rate. An asserted time of the first phase signal and an asserted time of the second phase signal are separated by a predefined non-overlap time. The apparatus also includes a switched-capacitor circuit with a plurality of switched capacitors operably coupled to the first phase signal and the second phase signal. An amplifier is operably coupled to the switched-capacitor circuit and has a response time inversely proportional to an adaptive bias current. A bias generator is coupled to the amplifier and operates to modify the adaptive bias current responsive to the asserted time of the first phase signal.

26 Claims, 4 Drawing Sheets

ACTIVE-TIME DEPENDENT BIAS CURRENT GENERATION FOR SWITCHED-CAPACITOR CIRCUITS

RELATED APPLICATIONS

This application is related to U.S. patent application Ser. No. 12/185,046, filed Aug. 1, 2008 entitled "Adaptive Bias Current Generation for Switched-Capacitor Circuits" assigned to the assignee hereof and the disclosure of which application is incorporated herein in its entirety by reference.

BACKGROUND

1. Field

The present disclosure relates generally to electronics, and more specifically to techniques for generating bias current for switched-capacitor circuits.

2. Background

A switched-capacitor circuit is a circuit that moves charges between different sampling capacitors in order to achieve a desired signal processing function that emulates a resistor network. The switched-capacitor circuit can accurately implement the signal processing function based on ratios of capacitor sizes and a sampling rate for charging and discharging the capacitors, both of which can often be obtained with high precision. Switched-capacitor circuits are widely used to implement various circuit blocks such as analog-to-digital converters (ADCs), digital-to-analog converters (DACs), filters, amplifiers, decimators, and the like.

A switched-capacitor circuit typically includes an active circuit such as an operational amplifier for amplifying an input signal and distributing charge between the sampling capacitors. The active circuit may be biased such that it can adequately respond to the highest expected sampling frequencies under worst-case conditions of semiconductor process, temperature, and voltage (PVT). This biasing causes the active circuit to burn significant power, which may be wasted in lower sampling frequency applications or better PVT conditions.

Figure 1:
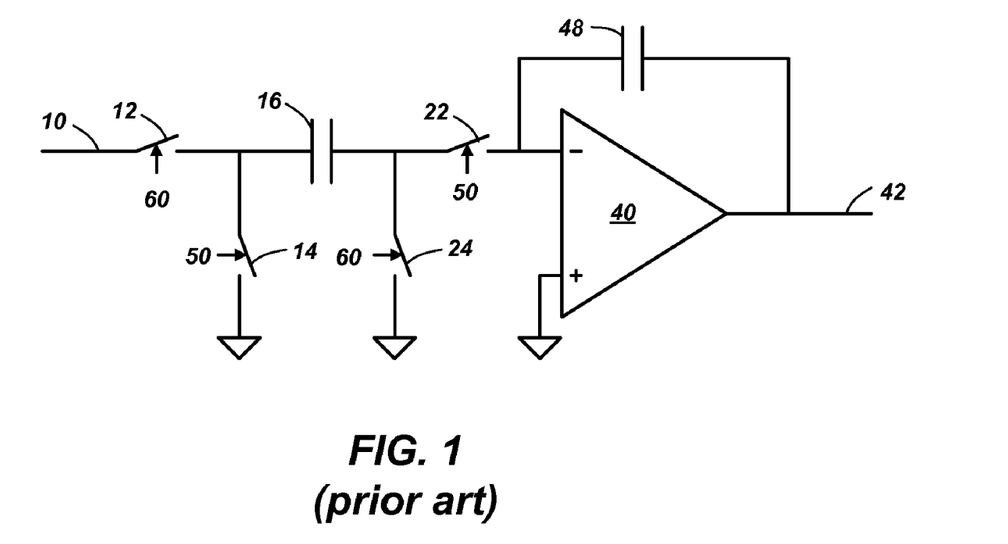
FIG. 1 shows a schematic diagram of a conventional switched capacitor integrator.

FIG. 1 illustrates a conventional implementation of a switched capacitor integrator. An input signal 10 feeds a first switch 12, which is coupled to a first capacitor 16 and a second switch 14. The other side of the first capacitor 16 is coupled to a third switch 22 and a fourth switch 24. The other side of the third switch 22 is coupled to an inverting input of an operational amplifier 40. A feedback capacitor 48 is coupled between an output 42 of the operational amplifier 40 and the inverting input. The non-inverting input is coupled to ground. The first switch 12 and fourth switch 24 are controlled by a second phase 60 of a control signal. Similarly, the second switch 12 and third switch 22 are controlled by a first phase 50 of the control signal.

Figure 2:
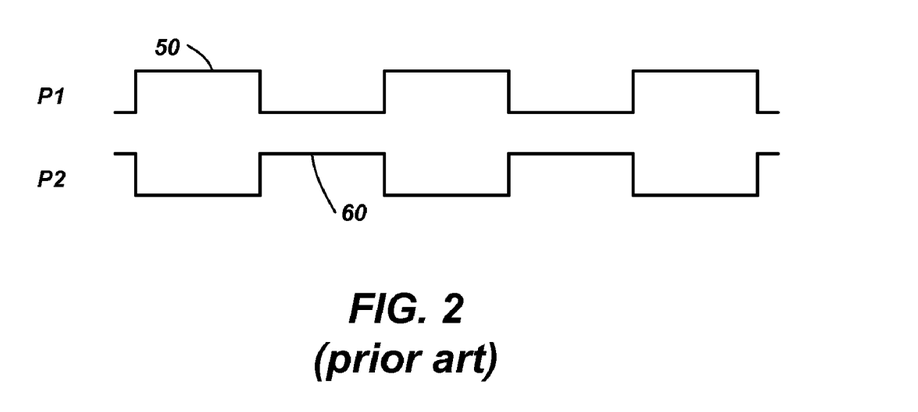
FIG. 2 shows a timing diagram of control signals for the circuit of FIG. 1.

FIG. 2 illustrates the first phase 50 and second phase 60 signals. As can be seen, the first phase 50 is high while the second phase 60 is low and the first phase 50 is low while the second phase 60 is high.

In operation, while the second phase 60 is asserted, the input signal 10 will charge the first capacitor 16 through the first switch 12 while the second switch 14 is open and with the opposite side of the first capacitor 16 coupled to ground through the fourth switch 24. During the time when the first phase 50 is asserted, the second switch 14 and third switch 22 close and the first capacitor 16 will discharge onto the inverting input of the operational amplifier 40 and the second capacitor 48. The combination of the operational amplifier 40 and the second capacitor 48, along with the switched capacitor input function performs an integration function of the input signal 10 such that the output 42 is an integrated signal of the input signal 10.

Operational amplifiers are configured with a response time. For the integrator to perform properly, the response time must be fast enough to respond within the time available (i.e., the asserted time of phase 50) to the operational amplifier. Thus, conventional switched capacitor circuits must be built with an operational amplifier that can respond adequately to the fastest expected sampling frequency (i.e., the smallest asserted time of phase 50). However, if the switched capacitor circuit is running at a slower sampling frequency, the fast operational amplifier will burn more power than is necessary because a slower operational amplifier could have been used.

There is a need for methods and apparatuses for modifying operational amplifiers of switched capacitor circuits such that power of the operational amplifier is adjustable and correlated to a sampling frequency of operation to reduce power of the operational amplifier when it is running slower and decrease response time of the operational amplifier when it is running faster.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

In this description, circuits and functions may be shown in block diagram form in order not to obscure the present invention in unnecessary detail. Furthermore, specific circuit implementations shown and described are only examples and should not be construed as the only way to implement the present invention unless specified otherwise herein. Block definitions and partitioning of logic between various blocks represent a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but may be based on silicon-germanium, silicon-on-insulator, silicon-on-sapphire, germanium, or gallium arsenide, among others.

Exemplary embodiments of the invention include methods and apparatus for biasing an operational amplifier of switched capacitor circuits such that a response time or bandwidth of the operational amplifier is correlated to a control pulse active time to keep power to only what is required to maintain appropriate settling time for the active time.

The exemplary methods and apparatuses described herein may be used for switched-capacitor circuits used for various circuit blocks such as ADCs, DACs, filters, integrators, amplifiers, decimators, etc. The techniques may also be used for various applications such as wireless communication, computing, networking, consumer electronics, etc. The techniques may also be used for various devices such as wireless communication devices, cellular phones, personal digital assistants (PDAs), handheld devices, wireless modems, laptop computers, cordless phones, Bluetooth devices, broadcast receivers, consumer electronics devices, etc. As a non-limiting example, the use of the techniques in a wireless communication device, which may be a cellular phone or some other device, is described below.

First, a non-limiting example of an ADC is described to show an example of how embodiments of the present invention may be used. Then, details of exemplary embodiments of the present invention are described in detail.

Figure 3:
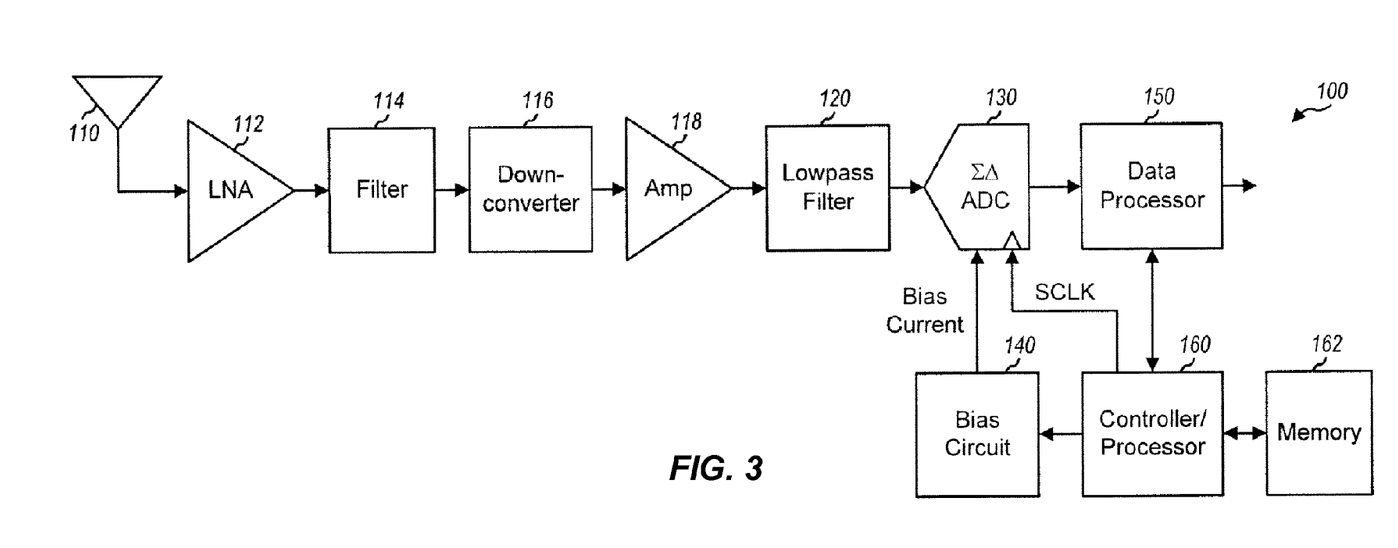
FIG. 3 shows a block diagram of a Wireless Communication Device.

FIG. 3 shows a block diagram of a design of a wireless communication device 100. For simplicity, only the receiver portion is shown in FIG. 3. Also for simplicity, only one receive chain for one antenna is shown in FIG. 3. In general, a wireless device may include any number of receive chains for any number of antennas, any number of frequency bands, and any number of radio technologies.

An antenna 110 receives radio frequency (RF) modulated signals transmitted by base stations and provides a received RF signal. A low noise amplifier (LNA) 112 amplifies the received RF signal and provides an amplified RF signal. A filter 114 filters the amplified RF signal to pass signal components in a frequency band of interest and to remove out-of-band noise and undesired signals. A down-converter 116 frequency down-converts the filtered RF signal with a local oscillator (LO) signal (not shown) and provides a down-converted signal. The frequency of the LO signal is selected such that a desired signal in a selected frequency channel is down-converted to baseband or near-baseband. An amplifier (Amp) 118 amplifies the down-converted signal and provides a signal having a desired signal level. A lowpass filter 120 filters the signal from amplifier 118 to pass the desired signal in the selected frequency channel and to remove noise and undesired signals that may be generated by the down-conversion process.

A ΣΔ ADC 130 digitizes the analog signal from lowpass filter 120 based on a sampling clock SCLK and provides digital samples to a data processor 150. ΣΔ ADC 130 may provide certain advantages such as better linearity, improved quantization noise characteristics, and simpler implementation over other types of ADC. ΣΔ ADC 130 can perform analog-to-digital conversion of the analog signal by making successive one-bit approximations of the change in the amplitude of the analog signal at a sampling rate that is many times greater than the desired signal bandwidth. The digital samples include the desired signal and quantization noise. ΣΔ ADC 130 may be designed such that the quantization noise is pushed (or noise shaped) out of band so that it can be more easily filtered.

A bias circuit 140 (also referred to as a bias generator) generates a bias current for ΣΔ ADC 130 as described below. ΣΔ ADC 130 and bias circuit 140 may be implemented on an analog IC, an RF IC (RFIC), a mixed signal IC, an application specific integrated circuit (ASIC), etc. Any suitable process may be used, such as, for example, bipolar and CMOS processes, with a suitable substrate for the process.

Data processor 150 may include various units for processing the digital samples from ΣΔ ADC 130. For example, data processor 150 may include one or more digital signal processors (DSPs), reduced instruction set computer (RISC) processors, central processing units (CPUs), etc. A controller/processor 160 may control the operation of wireless device 100. Controller/processor 160 may generate the sampling clock for ΣΔ ADC 130 and control signals for bias circuit 140, as shown in FIG. 3. The sampling clock and control signals may also be generated by some other unit within wireless device 100. A memory 162 may store program codes and data for wireless device 100. Of course, in some exemplary embodiments, data processor 150 and controller/processor 160 may be the same functional unit.

FIG. 3 shows a design of an exemplary receiver implemented with a direct-conversion architecture, which is also referred to as a zero-IF (ZIF) architecture. In the direct-conversion architecture, an RF signal is frequency down-converted directly from RF to baseband in one stage. A receiver may also be implemented with a super-heterodyne architecture in which an RF signal is frequency down-converted in multiple stages, e.g., from RF to an intermediate frequency (IF) in one stage, and then from IF to baseband in another stage. The super-heterodyne and direct-conversion architectures may use different circuit blocks and/or have different requirements.

In addition, FIG. 3 shows a specific receiver design with a ΣΔ ADC. A receiver may also include different and/or additional circuit blocks not shown in FIG. 1. For example, ΣΔ ADC 130 may be replaced with a regular ADC, lowpass filter 120 may be replaced with a switched-capacitor filter, etc. In general, a receiver may include any number of switched-capacitor circuits for any number of circuit blocks. For simplicity, and not limitation, much of the description below assumes that ΣΔ ADC 130 is the only switched-capacitor circuit within wireless device 100.

Wireless device 100 may support one or more radio technologies for wireless communication, terrestrial broadcast, satellite communication, etc. For example, wireless device 100 may support one or more of the following radio technologies:
- Global System for Mobile Communications (GSM), Wideband Code Division Multiple Access (WCDMA), Long Term Evolution (LTE), and/or other radio technologies from an organization named "3rd Generation Partnership Project" (3GPP),
- CDMA2000 1X (or simply, 1X), CDMA2000 1xEV-DO (or simply, 1xEV-DO), Ultra Mobile Broadband (UMB), and/or other radio technologies from an organization named "3rd Generation Partnership Project 2" (3GPP2),
- IEEE 802.11 (Wi-Fi), IEEE 802.16 (WiMAX), IEEE 802.20, and/or other radio technologies from IEEE,
- Digital Video Broadcasting for Handhelds (DVB-H), Integrated Services Digital Broadcasting for Terrestrial Television Broadcasting (ISDB-T), MediaFLO™, and/or other digital broadcast technologies, and
- United States Global Positioning System (GPS), European Galileo, Russian GLONASS, or Global Navigation Satellite System (GNSS).

Wireless device 100 may support multiple modes of operation for one or more radio technologies. Each mode may be for a specific signal bandwidth in a specific radio technology. LTE and UMB support variable signal bandwidth, and multiple modes may be defined for different possible signal bandwidths in LTE and UMB. ΣΔ ADC 130 and other switched-capacitor circuits within wireless device 100 may be designed to handle all of the modes supported by wireless device 100.

ΣΔ ADC 130 may be implemented with various designs such as a single-loop ΣΔ ADC, a MASH ΣΔ ADC, etc. ΣΔ ADC 130 may also be implemented with any order, e.g., first order, second order, or higher order. In general, higher order may provide better performance at the expense of greater circuit complexity.

Figure 4:
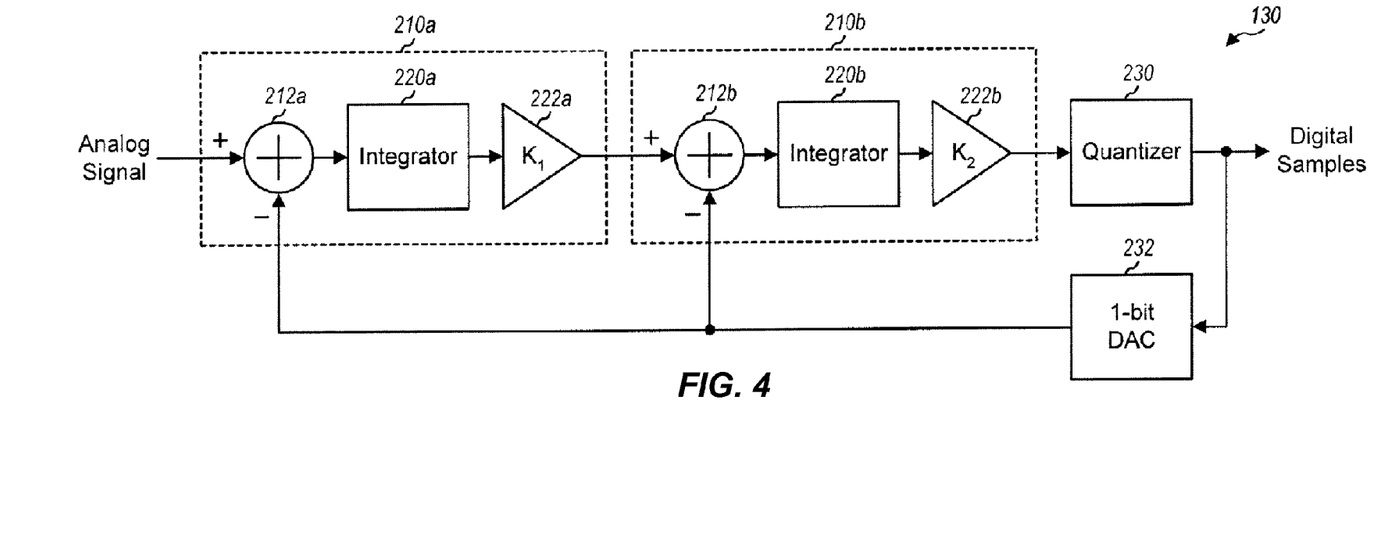
FIG. 4 shows a block diagram of a $\Sigma\Delta$ ADC within a wireless receiver.

FIG. 4 shows a block diagram of a second-order ΣΔ ADC 130, which is one design of ΣΔ ADC 130 in FIG. 1. ΣΔ ADC 130 includes two sections 210a and 210b coupled in series, a quantizer 230, and a 1-bit DAC 232.

Within section 210a, a summer 212a subtracts a quantized signal outputted by DAC 232 from an analog signal. The output of summer 212a is integrated by an integrator 220a and amplified with a gain of K1 by an amplifier 222a to obtain an output of section 210a. Within section 210b, a summer 212b subtracts the quantized signal from the output of section 210a. The output of summer 212b is integrated by an integrator 220b and amplified with a gain of K2 by an amplifier 222b to obtain an output of section 210b. Quantizer 230 compares the output of section 210b against a reference voltage and provides 1-bit digital samples based on the comparison results. DAC 232 converts the digital samples to analog and provides the quantized signal.

Integrators 220a and 220b may be implemented with various switched-capacitor circuit designs such as a single-sampling switched capacitor circuit, a correlated double-sampling (CDS) circuit, an auto-zeroing (AZ) circuit, a chopper stabilization (CS) circuit, etc. A switched capacitor circuit employs one or more amplifiers, capacitors, and switches, all of which may be readily fabricated in complementary metal oxide semiconductor (CMOS).

Figure 5:
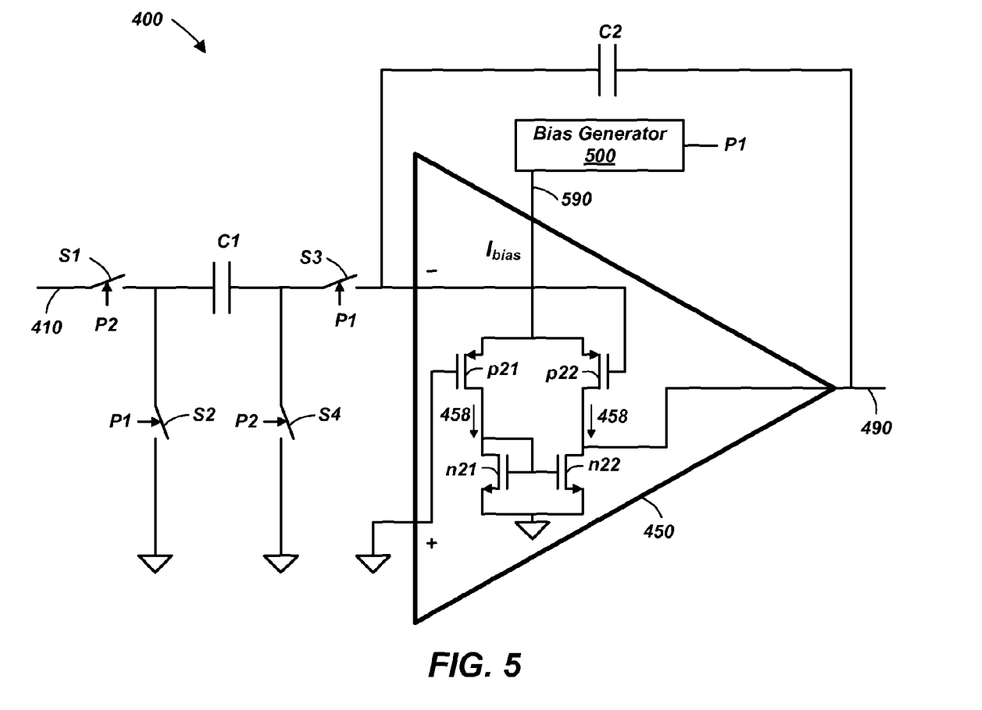
FIG. 5 shows a schematic diagram of a switched capacitor integrator according to an exemplary embodiment of the present invention.

FIG. 5 illustrates an implementation of a switched capacitor integrator 400, as a non-limiting example of a switched capacitor circuit using exemplary embodiments of the present invention. An input signal 410 feeds a first switch S1, which is coupled to a first capacitor C1 and a second switch S2. The other side of the first capacitor C1 is coupled to a third switch S3 and a fourth switch S4. The other side of the third switch S3 is coupled to an inverting input of an operational amplifier 450. The other side of the fourth switch S4 is coupled to ground. A feedback capacitor C2 is coupled between an output 490 of the operation amplifier 450 and the inverting input. The non-inverting input is coupled to ground. The second switch S2 and the third switch S3 are controlled by a first phase signal P1. Similarly, the first switch S1 and the fourth switch S4 are controlled by a second phase signal P2.

Figure 6:
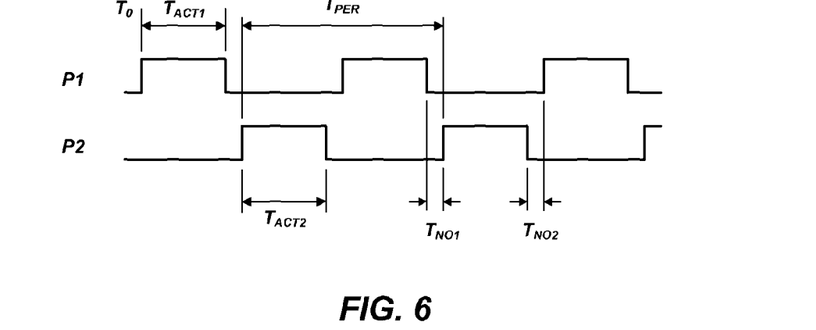
FIG. 6 shows a timing diagram of control signals for the circuit of FIG. 5.

FIG. 6 illustrates the first phase signal P1 and the second phase signal P2. As can be seen, the first phase signal P1 is high while the second phase signal P2 is low and the first phase signal P1 is low while the second phase signal P2 is high. As used herein, the asserted time (i.e., active time) of each phase is defined as the high pulse-width time. Of course, those of ordinary skill in the art will recognize that the asserted time could be the low pulse-width time. In many switched capacitor circuits, the dual phase control signals (i.e., the first phase signal P1 and the second phase signal P2) are configured to be non-overlapping. This non-overlap time, shown as $T_{NO1}$ and $T_{NO2}$, ensures that switches that may charge a capacitor are shut off before switches that may discharge a capacitor are turned on. However, the non-overlap time also reduces the amount of active time $T_{ACT}$ for charging a capacitor or discharging a capacitor onto an integration node such as the non-inverting input of operation amplifier 450. As used herein, $T_{ACT}$ generically refers to active times $T_{ACT1}$ and $T_{ACT2}$. Thus, the active time for the first phase signal P1 and a given clock period $T_{PER}$ is:

$$T_{ACT1} = T_{PER} - T_{ACT2} - T_{NO1} - T_{NO2}.$$

With a smaller active time $T_{ACT}$, the operation amplifier must have a faster response time to completely respond to the signal discharged from capacitor C1 during the active time $T_{ACT}$.

Returning to FIG. 5, the operation amplifier 450 includes a well-known circuit configurations generally referred to as a current mirror. In the operation amplifier 450, the n-channel transistor n21 (also referred to as a reference transistor n21) is connected in a diode configuration with the gate and drain connected together. The reference transistor n21 operates in the saturation region because the gate and drain are connected to the same potential. As a result, the transistor operates with voltage to current properties similar to a p-n junction diode.

The current mirror configuration comprises two transistors of the same type (e.g., both p-channels or both n-channels) in which the sources of the transistors are connected together and the gates of the transistors are connected together. Current mirrors operate on the theory that if the two transistors are similarly processed and have sizes W/L (i.e., width/length) in a defined proportion N, then the current relationship through the two transistors will have the same proportion N. For example, in the operation amplifier 450, if the reference transistor n21 and a current mirror transistor n22 have the same W/L, they will have substantially the same amount of current flowing through them. This is so because both transistors are connected to the same source, and have the same gate to source voltage, which defines the magnitude of the drain current. Typically, current mirrors are designed with the two transistors having the same size (i.e., the proportion N=1). However, other proportions may be used.

The current mirror configuration, comprising the reference transistor n21 and the current mirror transistor n22, creates proportional active loads 458 for a differential transistor pair comprising a first differential transistor p21 and a second differential transistor p22.

The drains of the differential transistor pair are coupled to the current mirror and the sources of the differential transistor pair are connected to an adaptive bias current Ibias 590 (also referred to herein as a bias current source). The gate of the first differential transistor p21 is coupled to the non-inverting input and the gate of the second differential transistor p22 is connected to the inverting input. The bias current source provides the adaptive bias current 590 for setting a desired operating point for the differential transistor pair. In operation of the operation amplifier 450, the differential transistor pair (p21 and p22) amplifies a voltage difference between the non-inverting input and the inverting input.

The operation amplifier 450 is a non-limiting example of a type of amplifier that may be used in embodiments of the invention. Other more complex amplifiers may also be used. As other non-limiting examples, the amplifier may include other bias circuits to control various bias points, additional gain stages, and combinations thereof.

In operation of the switched capacitor integrator 400, while the second phase signal P2 is asserted (i.e., active), the input signal 410 will charge the first capacitor C1 through the first switch S1 with the opposite side of the first capacitor C1 coupled to ground through the fourth switch S4. During the time when the first phase signal P1 is asserted, the second switch S2 and the third switch S3 close and the first capacitor C1 will discharge onto the inverting input of the operational amplifier 450 and the feedback capacitor C2 through the second switch S2. The combination of the operational amplifier 450 and the feedback capacitor C2, along with the switched capacitor input function performs an integration function of the input signal 410 such that the output 490 is an integrated signal of the input signal 410.

As noted above, wireless device 100 may support multiple modes for multiple radio technologies. Different modes may be associated with different signal bandwidths. For example, wireless device 100 may support two modes for GSM and WCDMA. The signal bandwidth for GSM may be 100 kilohertz (KHz) whereas the signal bandwidth for WCDMA may be 1.92 megahertz (MHz).

As a result, the speed requirement of ΣΔ ADC 130 may be different for different modes. In general, progressively faster speed is needed for ΣΔ ADC 130 for progressively larger signal bandwidth. To support multiple modes, ΣΔ ADC 130 may be designed with adaptable speed. A bias generator (500 in FIG. 5 or 140 in FIG. 3) may be used to generate the adaptive bias current 590 for ΣΔ ADC 130 for different modes.

In an exemplary embodiment of the invention, a switched capacitor circuit (e.g., a ΣΔ ADC) may be designed and operated to have performance that can be varied based on the active time of the first phase signal P1 or the second phase signal P2 (i.e. the $T_{ACT1}$ or $T_{ACT2}$). This may be achieved by using an operational amplifier 450 having a bandwidth that is proportional to an adaptive bias current 590. The adaptive bias current 590 can be generated to be inversely proportional to the active time $T_{ACT}$. This adaptive bias current 590 may allow the speed of the switched-capacitor circuit to be varied for different modes by changing the bias current, which may ensure that the speed of the switched-capacitor circuit is adequate for the sampling rate while not using excess power.

Figure 7:
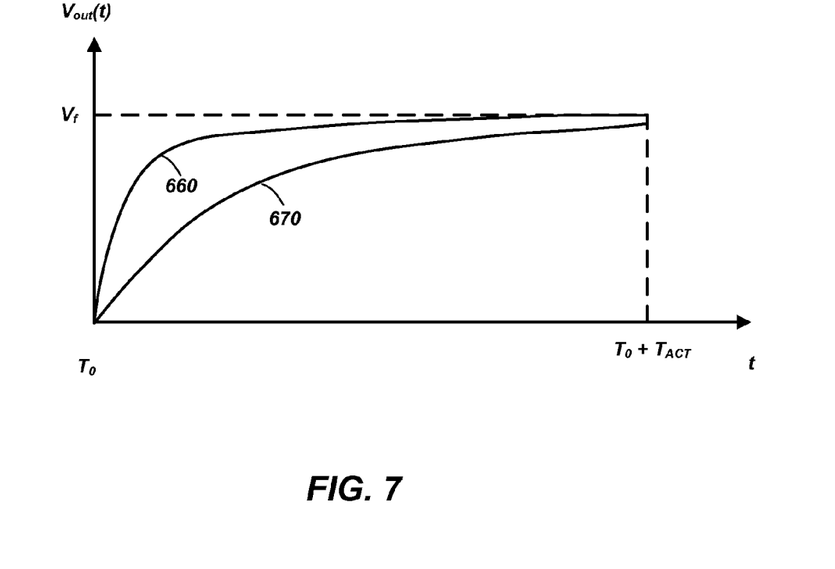
FIG. 7 shows a plot of output response for operational amplifiers with different response time.

FIG. 7 illustrates $V_{out}$ 660 for a faster operational amplifier and a $V_{out}$ 670 for a slower operational amplifier. In general, faster operational amplifiers must burn more power in order to have the faster response time. Referring to FIGS. 6 and 7, a given voltage $V_f$ must be reached on the output ($V_{out}(t)$) of the operational amplifier to ensure a fast enough response time for a given frequency of operation. As can be seen, the output 660 of the faster operation amplifier achieves this output voltage $V_f$ in the time period between $T_0$ and $(T_0 + T_{ACT})$. The output 670 of the slower operation amplifier does not quite achieve $V_f$ and would exhibit degraded performance if used in a system with an active pulse-width of $T_{ACT}$.

Returning to FIG. 5, the bandwidth (or response time) of the operation amplifier 450 can be adjusted using the adaptive bias current 590 developed by the bias generator 500.

Figure 8:
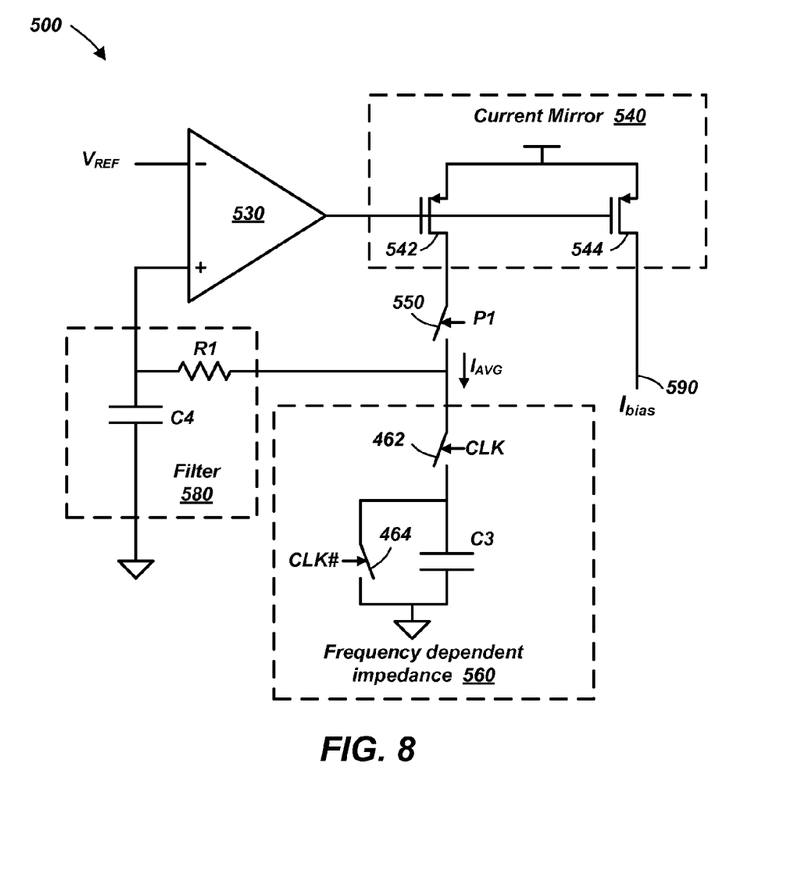
FIG. 8 shows a bias generator according to an exemplary embodiment of the present invention.

FIG. 8 shows a schematic diagram of a bias generator 500 suitable for generating the adaptive bias current 590 to control amplifier 450 in FIG. 5 as well as other switched capacitor circuits, including some FIGS. 3 & 4 circuits, such as the LPF 120, filter 114, and integrators 220a and 220b. The bias generator 500 can adaptively generate the adaptive bias current 590 for a switched-capacitor circuit (e.g., ΣΔ ADC 130) based on a selected mode and to track variations in IC process and temperature.

In the design shown in FIG. 8, the bias generator 500 includes a bias amplifier 530 fed by a bias voltage $V_{REF}$ at its inverting input, a current mirror 540, a feedback switch 550, a frequency dependent impedance 560, and an optional filter 580.

The bias voltage $V_{REF}$ may be generated with a bandgap voltage reference and may be approximately constant across IC process and temperature variations. The bias voltage $V_{REF}$ may also be generated with other voltage references and may have any suitable value. The bias amplifier 530 is referred to as a bias amplifier only to distinguish it from the operational amplifier 450 of FIG. 5, any suitable amplifier may be used for bias amplifier 530.

The optional filter may include one or more capacitors and resistors such as the simple filter shown as R1 and C4. This optional filter may reduce noise and current spikes associated with the charging and discharging of switched capacitors.

The frequency dependent impedance 560 is a switched capacitor load, which operates at the same frequency (via signals CLK and CLK#) as the first phase signal P1 and the second phase signal P2 but need not have any specific phase relationship thereto. Thus, in some embodiments CLK and CLK# may be driven by versions of the first phase signal P1 and the second phase signal P2. The frequency dependent impedance realizes an equivalent resistance by averaging the charge in capacitor C3 over a clock cycle. The averaging is accomplished by switch 462 and switch 464. While CLK is asserted, the capacitor C3 charges and while CLK# is asserted, the capacitor C3 discharges. As noted earlier, CLK and CLK# should not be asserted at the same time, as it may cause a short to ground when both switches 462 and 464 are closed. Thus, an average current $I_{AVG}$ flows through the equivalent resistance:

$$R_{EQ}=1/(f*C3)=T_{PER}/C3.$$

Assume, for analysis, the feedback switch 550 is always closed. In this case, $I_{AVG}$ will be available to a first transistor 542 of the current mirror 540. Due to current mirroring, as described above, the amount of current flowing through the first transistor 542 (or proportional amount of current) will flow through second transistor 544 to generate the adaptive bias current 590. For the balance of the discussion, the first transistor 542 and the second transistor 544 will be assumed to be the same size. As a result, with the feedback switch 550 closed the adaptive bias current 590 would be:

$$I_{BIAS}=V_{REF}/R_{EQ}=(V_{REF}*C3)/T_{PER}$$

However, when the feedback switch 550 is operated by the first phase signal P1, the adaptive bias current 590 will be inversely proportional to an active time $T_{ACT}$ of the first phase signal P1. In other words, the adaptive bias current 590 is:

$$I_{BIAS}=(V_{REF}/R_{EQ})*(T_{PER}/T_{ACT})=(V_{REF}*C3)/T_{ACT}$$

Thus, the adaptive bias current 590 is inversely proportional to the active pulse width $T_{ACT1}$ of the first phase signal P1. Similarly, the adaptive bias current 590 is proportional to the capacitance of C3 and the voltage reference $V_{REF}$.

Thus, the design shown in FIG. 8 allows the bias current $I_{BIAS}$ to be adaptively generated based on a selected mode. The bias current is inversely proportional to the active time $T_{ACT1}$, which may be determined based on the selected mode. For modes with higher speed, a higher sampling rate is applied, and larger bias current is generated by bias generator 500.

In addition, the design in FIG. 8 allows the bias current to track changes in sampling capacitors in the integrators for the ΣΔ ADC due to variations in IC process and temperature. The bias current is proportional to capacitance C3, which may vary over IC process and temperature in the same manner as the sampling capacitors in the various switched-capacitor circuits. For example, if the sampling capacitors within the ΣΔ ADC becomes larger due to IC process, then capacitor C3 would become larger by approximately the same percentage, and the adaptive bias current 590 would generate a proportionally larger bias current, which would then allow the OTAs within the ΣΔ ADC to have a faster response time.

Furthermore, exemplary embodiments of the invention adapt to changes in PVT that may translate into changes in the duration of $T_{ACT}$. For a given mode (e.g., a given sampling frequency) the $T_{ACT}$ may still vary due to the way the non-overlap times ($T_{NO1}$ and $T_{NO2}$) are realized. The non-overlapping clocks may be generated, for example, using delay cells that are susceptible to PVT variations. Thus, changes in the adaptive bias current 590 would indirectly track changes in delays in the clock generator, which cause changes in $T_{ACT}$.

The techniques described herein may be able to reduce power consumption and improve performance for a ΣΔ ADC and other switched-capacitor circuits since the adaptively generated bias current can ensure sufficient speed for worst-case conditions, without the need for a large margin for the bias current. The performance of the ΣΔ ADC and other switched-capacitor circuits may also vary within a tighter range across IC process and temperature corners with the use of the adaptively generated bias current, which may improve yield. The techniques are especially beneficial when a large number of modes are supported. For example, there may be 10 modes for UMB with different sampling rates. The techniques can readily generate different bias currents for all of the modes to achieve lower power consumption and good ADC performance.

The techniques and the bias circuit described herein may be implemented on an IC, an analog IC, an RFIC, a mixed-signal IC, an ASIC, a printed circuit board (PCB), an electronics device, etc. The bias circuit may also be fabricated with various IC process technologies such as CMOS, NMOS, PMOS, bipolar junction transistor (BJT), bipolar-CMOS (BiCMOS), silicon germanium (SiGe), gallium arsenide (GaAs), etc.

An apparatus implementing the techniques described herein may be a stand-alone device or may be part of a larger device. A device may be; a stand-alone IC, a set of one or more ICs that may include memory ICs for storing data and/or instructions, an RFIC such as an RF receiver (RFR) or an RF transmitter/receiver (RTR), an ASIC such as a mobile station modem (MSM), a module that may be embedded within other devices, a receiver, cellular phone, wireless device, handset, or mobile unit, or other suitable device.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the disclosed invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus, comprising:
   a first phase signal and a second phase signal operating at a sampling rate, wherein an asserted time of the first phase signal and an asserted time of the second phase signal are separated by a predefined non-overlap time;
   a switched-capacitor circuit comprising a plurality of switched capacitors operably coupled to the first phase signal and the second phase signal;
   an amplifier operably coupled to the switched-capacitor circuit and having a response time inversely proportional to an adaptive bias current; and
   a bias generator coupled to the amplifier and operative to modify the adaptive bias current inversely proportional to an asserted pulse width of the first phase signal, the adaptive bias current adaptable to support a first bandwidth of a first communication mode and a second different bandwidth of a second different communication mode.

2. The apparatus of claim 1, wherein the sampling rate for the switched-capacitor circuit is a variable sampling rate, and wherein the asserted times of the first phase signal and the second phase signal are proportional to the variable sampling rate.

3. The apparatus of claim 1, wherein the switched-capacitor circuit comprises circuit to perform a function selected from the group consisting of a filter, an integrator, an amplifier, and a decimator.

4. The apparatus of claim 1, wherein the switched-capacitor circuit comprises a sigma-delta analog-to-digital converter ($\Sigma\Delta$ ADC) operative to digitize an analog signal at the sampling rate and provide digital samples.

5. The apparatus of claim 1, wherein the sampling rate is determined based on a mode selected from among multiple modes associated with different sampling rates, and wherein the bias generator is operative to generate the adaptive bias current to be proportional to the asserted time of the first phase signal for a $\Sigma\Delta$ ADC.

6. The apparatus of claim 1, wherein the bias generator is operative to generate the adaptive bias current based on at least one capacitor in the bias generator tracking the plurality of switched capacitors in the switched-capacitor circuit through variations in IC process.

7. The apparatus of claim 1, wherein the bias generator comprises:
   a bias amplifier comprising an inverting input operably coupled to a reference voltage, a non-inverting input, and an output;
   a feedback switch controlled by the first phase signal with a first side coupled to the output of the amplifier;
   a frequency dependent impedance coupled to a second side of the feedback switch and configured as a switched capacitor network operating at a same frequency as the first phase signal;
   a feedback signal coupled between the second side of the feedback switch and the non-inverting input of the amplifier; and
   and a current mirror operably coupled to the output of the amplifier to generate the adaptive bias current.

8. The apparatus of claim 7, wherein the frequency dependent impedance comprises:
   a first switch controlled by a first clock and operably coupled to the second side of the feedback switch;
   a capacitor coupled between the first switch and ground;
   a second switch controlled by a second clock and connected in parallel with the capacitor; and
   wherein the first clock and the second clock are operating at the sampling rate.

9. The apparatus of claim 7, further comprising a filter operably coupled in the feedback signal and comprising a resistor connected between the second side of the feedback switch and the non-inverting input and a capacitor connected between the non-inverting input and ground.

10. The apparatus of claim 1, wherein the apparatus is an integrated circuit.

11. An apparatus, comprising:
    a first phase signal and a second phase signal operating at a sampling rate, wherein an asserted time of the first phase signal and an asserted time of the second phase signal are separated by a predefined non-overlap time;
    a bias generator configured to generate an adaptive bias current responsive to the asserted time of the first phase signal, the bias generator comprising:
       a bias amplifier comprising an inverting input operably coupled to a reference voltage, a non-inverting input, and an output;
       a feedback switch controlled by the first phase signal with a first side coupled to the output of the amplifier;
       a frequency dependent impedance coupled to a second side of the feedback switch and configured as a switched capacitor network operating at a same frequency as the first phase signal;
       a feedback signal coupled between the second side of the feedback switch and the non-inverting input of the amplifier; and
       and a current mirror operably coupled to the output of the amplifier to generate the adaptive bias current;
    a plurality of switched capacitors operably coupled to the first phase signal and the second phase signal; and an amplifier operably coupled to the plurality of switched capacitors and the adaptive bias current and having a response time inversely proportional to the adaptive bias current.

12. The apparatus of claim 11, wherein the sampling rate for the switched-capacitor circuit is a variable sampling rate, and wherein the asserted times of the first phase signal and the second phase signal are proportional to the variable sampling rate.

13. The apparatus of claim 11, wherein the switched-capacitor circuit comprises circuit to perform a function selected from the group consisting of a filter, an integrator, an amplifier, and a decimator.

14. The apparatus of claim 11, wherein the switched-capacitor circuit comprises a sigma-delta analog-to-digital converter (ΣΔ ADC) operative to digitize an analog signal at the sampling rate and provide digital samples.

15. The apparatus of claim 11, wherein the sampling rate is determined based on a mode selected from among multiple modes associated with different sampling rates, and wherein the bias generator is operative to generate the adaptive bias current to be proportional to the asserted time of the first phase signal for a ΣΔ ADC.

16. The apparatus of claim 11, wherein the bias generator is operative to generate the adaptive bias current based on at least one capacitor in the bias generator tracking the plurality of switched capacitors in the switched-capacitor circuit through variations in IC process and temperature.

17. The apparatus of claim 11, wherein the frequency dependent impedance comprise
- a first switch controlled by a first clock and operably coupled to the second side of the feedback switch;
- a capacitor coupled between the first switch and ground;
- a second switch controlled by a second clock and connected in parallel with the capacitor; and
- wherein the first clock and the second clock are operating at the sampling rate.

18. The apparatus of claim 11, further comprising a filter operably coupled in the feedback signal and comprising a resistor connected between the second side of the feedback switch and the non-inverting input and a capacitor connected between the non-inverting input and ground.

19. The apparatus of claim 11, wherein the apparatus is an integrated circuit.

20. A method comprising:
- generating a first phase signal and a second phase signal, both operating a sampling rate, wherein an asserted time of the first phase signal and an asserted time of the second phase signal are separated by a predefined non-overlap time;
- operating a switched-capacitor circuit with the first phase signal and the second phase signal, the switched-capacitor circuit having a bandwidth proportional to an adaptive bias current; and
- generating the adaptive bias current inversely proportional to an asserted pulse width of the first phase signal, the adaptive bias current adaptable to support a first bandwidth of a first communication mode and a second different bandwidth of a second different communication mode.

21. The method of claim 20, further comprising:
- selecting a mode from among multiple modes associated with different sampling rates; and
- generating the adaptive bias current to be proportional to the asserted time of the first phase signal running at the sampling rate for the selected mode.

22. The method of claim 20, wherein the generating the bias current comprises generating the adaptive bias current based on at least one capacitor tracking a plurality of switched capacitors in the switched-capacitor circuit through variations in IC process and temperature.

23. An apparatus comprising:
- means for generating a first phase signal and a second phase signal, both operating a sampling rate, wherein an asserted time of the first phase signal and an asserted time of the second phase signal are separated by a predefined non-overlap time;
- means for operating a switched-capacitor circuit with the first phase signal and the second phase signal, the switched-capacitor circuit having a bandwidth proportional to an adaptive bias current; and
- means for generating the adaptive bias current inversely proportional to an asserted pulse width of the first phase signal, the adaptive bias current adaptable to support a first bandwidth of a first communication mode and a second different bandwidth of a second different communication mode.

24. The apparatus of claim 23, wherein the switched-capacitor circuit comprises a sigma-delta analog-to-digital converter (ΣΔ ADC), and wherein the means for operating the switched-capacitor circuit comprises means for digitizing an analog signal with a sigma-delta analog-to-digital converter (ΣΔ ADC) at the sampling rate to obtain digital samples.

25. The apparatus of claim 23, further comprising:
- means for selecting a mode from among multiple modes associated with different sampling rates; and
- means for generating the adaptive bias current to be proportional to the asserted time of the first phase signal running at the sampling rate for the selected mode.

26. The apparatus of claim 23, wherein the means for generating the adaptive bias current comprises means for generating the adaptive bias current based on at least one capacitor tracking a plurality of switched capacitors in the switched-capacitor circuit through variations in IC process and temperature.

\* \* \* \* \*